United States Patent [19]
Evans et al.

[11] 4,028,622
[45] June 7, 1977

[54] SELECTIVE INTERMODULATION DISTORTION MEASUREMENT

[75] Inventors: James Gifford Evans; Gerald Demarest Haynie, both of Colts Neck, N.J.

[73] Assignee: Bell Telephone Laboratories, Incorporated, Murray Hill, N.J.

[22] Filed: June 28, 1976

[21] Appl. No.: 700,537

[52] U.S. Cl. .............................. 324/57 N; 325/67; 325/363; 328/162; 331/78
[51] Int. Cl.² ...................................... G01R 27/00
[58] Field of Search ......... 324/57 N, 57 R; 325/67, 325/363; 328/162; 331/78; 235/152

[56] References Cited
UNITED STATES PATENTS

| | | | |
|---|---|---|---|
| 3,366,779 | 1/1968 | Catherall et al. | 235/152 |
| 3,718,813 | 2/1973 | Williams, Jr. et al. | 325/67 X |
| 3,742,381 | 6/1973 | Hurd | 331/78 |
| 3,875,500 | 4/1975 | Fletcher et al. | 325/67 X |
| 3,978,401 | 8/1976 | Lum | 324/57 N |

Primary Examiner—Stanley T. Krawczewicz
Attorney, Agent, or Firm—John Francis Moran

[57] ABSTRACT

An improved noise loading arrangement and method are disclosed capable of measuring low intensity intermodulaton distortion products, such as introduced in the operation of individual wideband transmission repeaters. The improved arrangement and method also have the further capability of resolving individual orders of distortion products. The arrangement utilizes a noise signal generator that produces a pseudorandom signal made of several spectral components providing high spectral density throughout a large bandwidth to simulate a broadband message load obtained by frequency multiplexing several independent signal sources. The noise signal is shifted in frequency before a quiet band is produced in the signal applied to the transmission apparatus to be tested. The orders of intermodulation distortion products appearing in the quiet band of the output signal of the transmission apparatus are individually measured to evaluate same. Automation of the test sequence is provided by a computer which acts as a general controller. The computer also processes the test data obtained by using a conventional signal averaging technique.

12 Claims, 3 Drawing Figures

SELECTIVE INTERMODULATION DISTORTION MEASUREMENT

BACKGROUND OF THE INVENTION

This invention relates to techniques for measuring nonlinearity in the operation of transmission systems and, in particular, to an arrangement and a method of precisely measuring selected intermodulation distortion products produced by noise loading of individual components, such as repeaters designed for high capacity, wide bandwidth transmission systems or any portion of such systems.

A conventional technique of testing an entire channel of a transmission system for nonlinear operation is by measuring the intermodulation distortion in the output signal of the channel introduced by the nonlinearity of the channel. This technique is generally known as noise loading and entails a source of random noise signals which are initially lowpass filtered. The filtered noise signal has statistical properties similar to an actual message load of several independent signals and is used to simulate same. The output of the lowpass filter is then band elimination filtered somewhere within the passband of the channel to provide at least one quiet band or notch in the filtered noise signal. When the latter signal is applied to the channel, nonlinear operation of the channel produces intermodulation distortion products some of which appear in the frequency band of the notch. Generally, these distortion products are dominantly second and third order products and to a much lesser extent higher orders of intermodulation distortion. Those distortion products in the frequency band of the notch, typically both second and third order distortion products, are selected from the signal output of the channel by a passband filter designed to pass signals at selected frequencies in the band of the notch. Some form of detector is used to measure the level of the distortion products and indicate the amount of nonlinearity of the channel under test.

Although the conventional noise loading approach is usually adequate for high intensity or readily detectable intermodulation distortion products such as encountered when evaluating overall channel performance, this technique is unsuitable for low intensity intermodulation distortion products at levels that are substantially less than ambient thermal noise levels. Low intensity intermodulation distortion products, which contribute to the overall distortion of the channel, are generally the contribution of segments or portions of the channel, for example, active components such as repeaters.

In order to increase the strength of the distortion products selected by filtering relative to the ambient noise, a process called signal averaging is used which requires a noise that is periodic. Successive sampling of the periodic signal at the same phase in the cycle enables detection of intermodulation products at levels substantially less than the ambient thermal noise level. Since the thermal noise is not periodic its contribution to the detected signal diminishes with successive samples while the intermodulation distortion products remain constant. Typically, a pseudorandom noise generator, which is a shift register with feedback, produces a random like signal that is periodic. This signal is lowpass filtered to provide a normal or Gaussian amplitude distribution of spectral components. The Gaussian distribution is desirable to produce a noise loading signal that closely resembles an actual message signal load transmitted by the system to simulate operating conditions. Substantial conformity to a Gaussian distribution requires the cutoff frequency of the lowpass filter to be at least an order of magnitude below the clock frequency which operates the shift register in the pseudorandom noise source. Because of the foregoing relationship, present shift registers do not operate fast enough to provide a Gaussian type noise signal which simulates a message load for a wideband transmission channel (e.g., bandwidths of 1 to 150 MHZ or more).

Another disadvantage is that the conventional technique is not able to resolve the third order intermodulation distortion from the usually much more intense second order distortion produced when a wideband noise loading signal is subjected to minor nonlinearities of individual transmission components. Throughout a transmission system, third order distortion is coherent and therefore cumulatively increases as the number of serial repeaters employed in the system increases, while second order distortion remains more or less constant. Thus, separate evaluation of the third order distortion produced in the pressure of second order distortion by each individual repeater is essential to predict overall performance of a transmission system. Such a system may be a submarine cable system or a single-sideband cable radio transmission system. Accurate evaluation of component nonlinearity also requires a testing arrangement with a sensitivity about 50 times greater than such a test on an overall system.

An object of this invention is to obtain accurate measurements of intermodulation distortion products of low intensity typically produced by individual system components of transmission systems.

A related object is to provide a periodic pseudorandom noise signal having a high density spectrum over a broad bandwidth that emulates Gaussian distributions in both the frequency domain and time domain.

A related object is to separate different orders of intermodulation distortion products so their individual intensity can be measured which would otherwise coincide in frequency due to the high spectral density and broad bandwidth properties of noise loading signals required to simulate broadband transmission signals.

SUMMARY OF THE INVENTION

In some of its broader aspects, the invention takes the form of a system and method for measuring low intensity harmonic distortion products introduced by transmission apparatus through the use of a uniquely generated noise loading signal which is translated in frequency. The frequency translation enables the resolution of individual orders of intermodulation distortion products produced by a noise signal which has normal statistical properties in the frequency and time domain.

The invention is an arrangement and a method wherein a unique source provides a noise signal made of spectral components having prescribed statistical characteristics. Each of the spectral components of the noise signal are shifted in frequency. Selected spectral components in the shifted noise signal are substantially eliminated to produce a quiet band in the noise signal applied to transmission apparatus. Various orders of intermodulation distortion products are introduced by nonlinear interaction of the spectral components of the noise signal applied to the transmission apparatus. A particular order of intermodulation distortion appearing in the quiet band is selected and its level indicated to obtain a measure of the nonlinearity in the operation of the transmission apparatus. The generated noise signal has a high spectral density which occupies a large bandwidth so that the signal simulates a broadband message load obtained by frequency multiplexing several independent sources. The shift in the frequencies of the spectral components of the generated noise signal produces frequency separations between the different orders of intermodulation distortion produced by the transmission apparatus and allows their independent evaluation which would otherwise be impossible.

In some of its more specific aspects, the invention utilizes a pseudorandom noise generator employing a plurality of feedback shift registers, each providing a predetermined sequence of characters. The feedback shift registers are preset to random initial states and clocked in unison as the sequences are combined to provide a multilevel signal with random properties. The signal is then shifted in one direction and then in an opposite direction by a different amount so that a residual shift in frequency is imparted on each spectral component of the noise signal. A frequency selective detecting circuit is used to measure a particular order of distortion due to the shift in frequency of the spectral components. The level of the particular distortion product is obtained by ratio measurement which compares the level of the product of a single frequency signal of prescribed amplitude injected into the signal measurement path. A plurality of matching filters are utilized to provide measurements at different points over the operating spectrum of the transmission apparatus.

BRIEF DESCRIPTION OF THE DRAWING

Features of the invention and additional objects of the invention will be more readily appreciated and better understood by reference to the following detailed description which should be considered in conjunction with the drawing:

FIG. 3 shows the contigous positions of FIGS. 1 and 2 in completing an arrangement of the invention.

DETAILED DESCRIPTION

Figure 1:
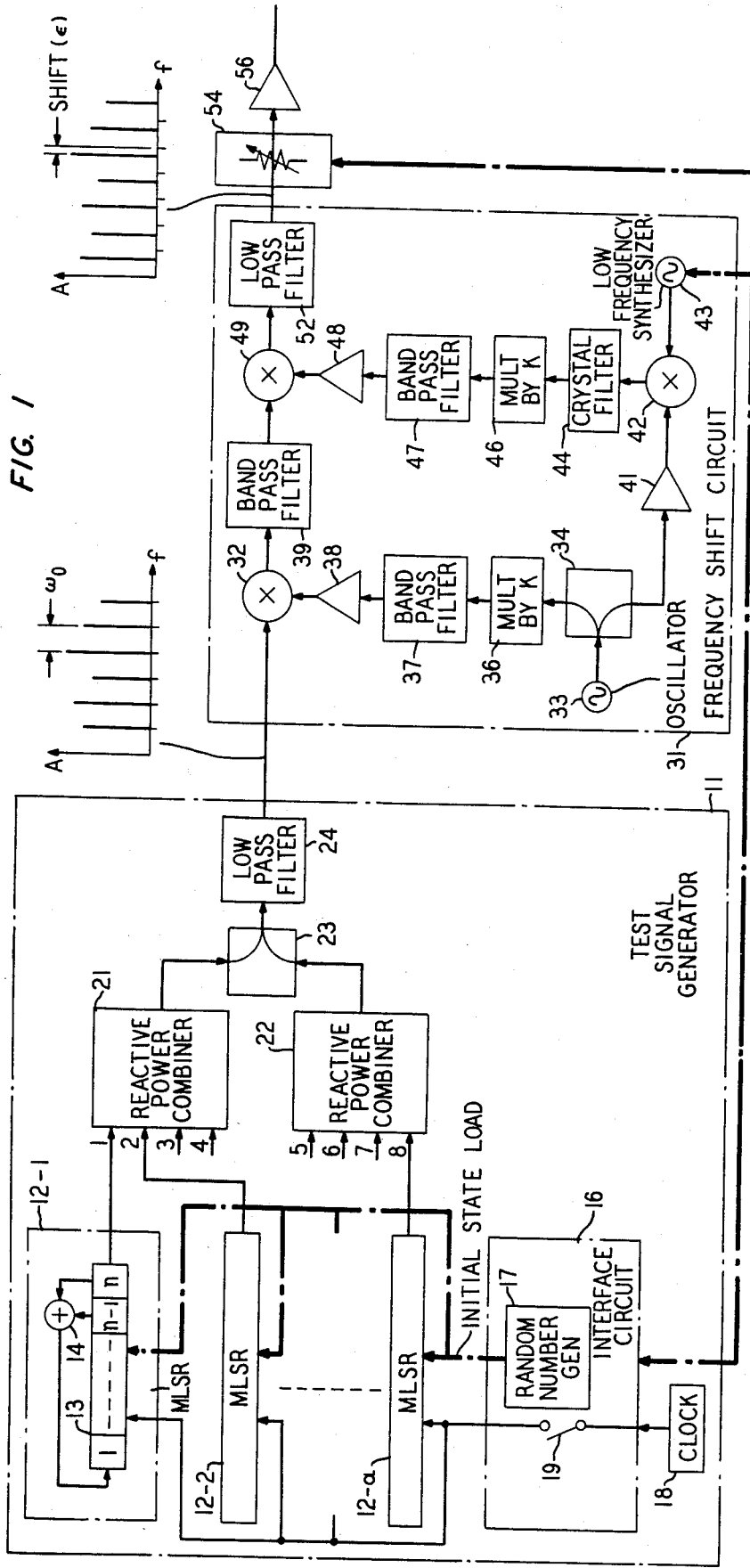
FIGS. 1 and 2 complete an overall block diagram of an improved noise loading measurement arrangement in accordance with the invention.

Before the inventive aspects of the illustrative embodiment are discussed in detail, a theoretical discussion concerning the nature of the intermodulation distortion products produced by nonlinear devices will serve to provide a basis for a thorough explanation of the invention. The random signal used to simulate a message load may be considered as the sum of a large number of small sinusoidal signals at several different frequencies when a random signal of given spectral density is applied to a linear system or linear device which has nonlinearities. The spectrum of the output signal from the system or device includes a portion which has the same spectral density as the input, a portion due to harmonics of the input frequencies, and a portion due to intermodulation distortion products of two or more spectral components.

The interaction of two spectral components produces two second order intermodulation products. Although second order products for an individual repeater are generally the largest of the distortion products introduced by it, second order intermodulation products are incoherent so that the overall effect of several serial repeaters is about the same as any one repeater. One second order product has a frequency corresponding to the sum of the frequencies of the two spectral components. The frequency of the other second order product corresponds to the difference between the frequencies of the two spectral components.

Third order intermodulation distortion products are produced by the interaction of three spectral components. Typically, third order intermodulation distortion products are weaker than second order products for an individual device, but the third order distortion products tend to be coherent and thus cumulative in nature so they become the most troublesome form of distortion in a signal transmitted via a transmission channel including a number of serial repeaters. This is the case although the contribution of each individual repeater to the third order distortion is likely to be small.

The problem of measurement of the third order intermodulation distortion is particularly difficult when the system or device is capable of uniformly passing a large band of frequencies and the noise signal is periodic. Any periodic noise signal has spectral components which are harmonically related. The large frequency band and the harmonically related spectral components occasions second and third order intermodulation distortion products that coincide in frequency. Accordingly, it is difficult to resolve the third order distortion from the more intense second order distortion and also the ambient thermal noise.

For example, one application of conventional noise loading may include a group of harmonically related spectral components to frequency $\omega_0$ in the noise signal. Specifically, $$A = 10\omega_0$$
$$B = 12\omega_0$$
$$C = 13\omega_0$$
$$D = 15\omega_0$$
$$E = 19\omega_0$$

A typical third order intermodulation distortion is:

$$A + B - C = 10\omega_0 + 12\omega_0 - 13\omega_0 = 9\omega_0$$

A second order intermodulation distortion also occurs at the same frequency. That is:

$$E - A = 19\omega_0 - 10\omega_0 = 9\omega_0$$

If the spectral components of the same noise signal are each shifted slightly in frequency by $\epsilon$, the harmonic relationship of the spectral components is destroyed. The group of spectral components will now have frequencies of:

$$A = 10\omega_0 + \epsilon$$
$$B = 12\omega_0 + \epsilon$$
$$C = 13\omega_0 + \epsilon$$
$$D = 15\omega_0 + \epsilon$$
$$E = 19\omega_0 + \epsilon$$

The second order intermodulation distortion produced by the corresponding shifted spectral components is:

$$E - A = (19\omega_0 + \epsilon) - (10\omega_0 + \epsilon) = 9\omega_0$$

However, the third order intermodulation distortion produced by the corresponding shifted spectral components is:

$$A + B - C = (10\omega_0 + \epsilon) + (12\omega_0 + \epsilon) - (13\omega_0 + \epsilon)$$
$$= 9\omega_0 + \epsilon$$

The third order product is therefore displaced in frequency from the second order product by the value of $\epsilon$. Further consideration of the shifted spectral components with regard to higher orders of intermodulation distortion products brings to light that higher order even products are shifted by even multiples of $\epsilon$ and higher order odd products are shifted by odd multiples of $\epsilon$. Thus, the even and odd orders are always separated in frequency by $\epsilon$.

Utilization of the foregoing principle in an illustrative embodiment of the invention provides selective and accurate evaluation of any desired order of intermodulation distortion among the number of products typically produced. The general impact of the foregoing statement is stressed although the illustrative embodiment is specifically directed toward measurment of third order intermodulation products. Measurement of other orders of intermodulation distortion products by those skilled in the art may be readily accomplished by proper selection of filter frequencies.

Figure 2:
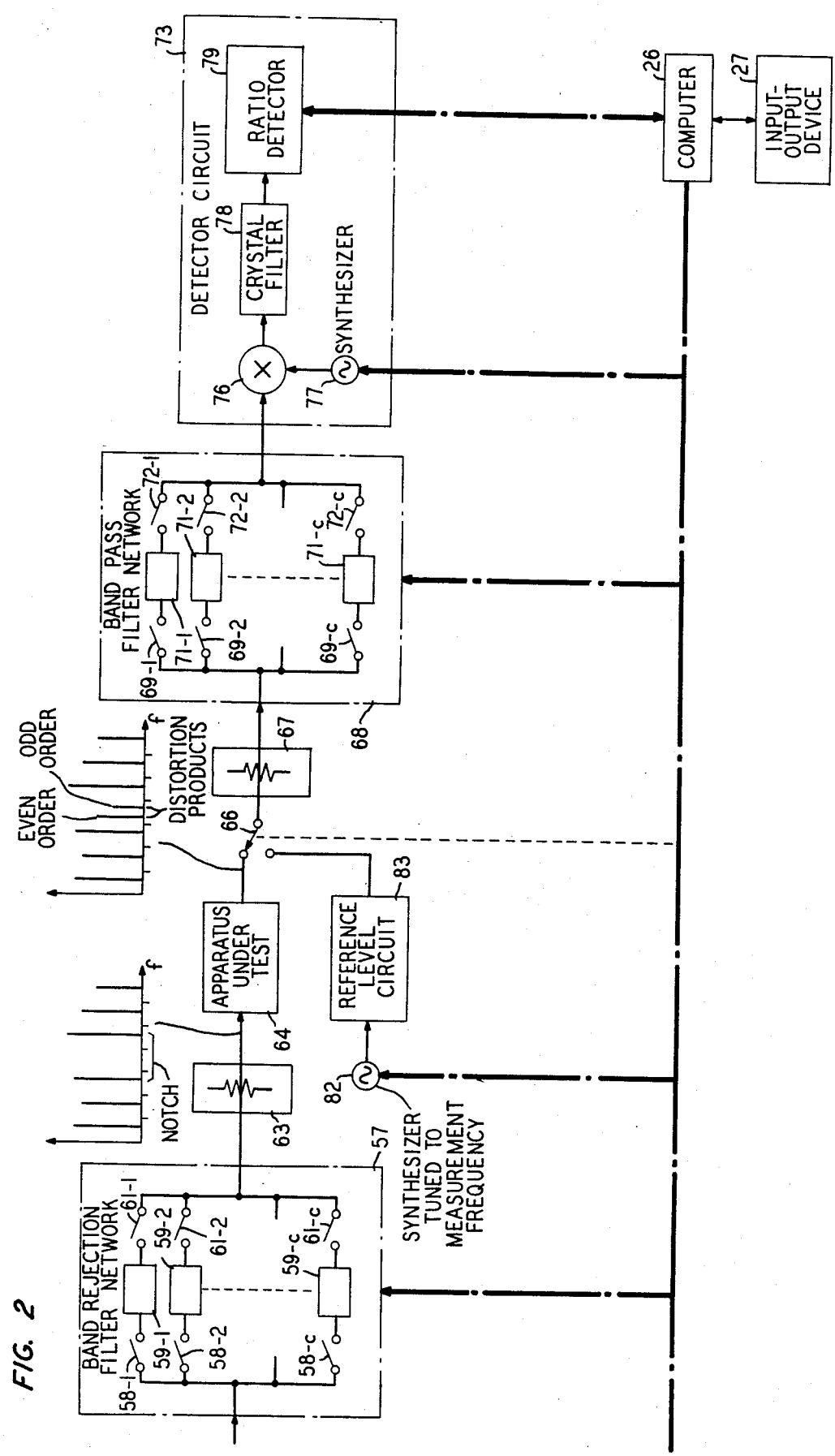

FIGS. 1 and 2, when oriented in accordance with FIG. 3, form a diagram of a noise loading test arrangement designed to use to advantage the theoretical material described in the foregoing discussion. In FIG. 1, test signal generator 11 supplies a noise loading signal of unique properties, which will subsequently be described in the context of the overall arrangement. Generator 11 is controlled by computer 26 shown in FIG. 2 to provide a desired sequence of test signals. Associated with computer 26 is input/output device 27 to access the computer and to direct same to perform computations on test data. It should be understood that the utilization of computer 26 and device 27 is strictly a matter of convenience in the implementation of the inventive test arrangement. Computer aided measurements are well known, and are disclosed: see, for example, "Role of Computing and Precision Measurements" by Chen et al. in *The Bell System Technical Journal*, December, 1974, Vol. 53, No. 10 at page 2249. Without computer 26 which operates as a controller and processor of test data, generator 11 along with the other components in the test arrangement of FIGS. 1 and 2 may be manually controlled to provide the same results in a manual fashion rather than as an automated test sequence.

In the arrangement of FIGS. 1 and 2 the noise loading signal of generator 11 is applied to frequency shift circuit 31. Shift circuit changes the frequency of each spectral component in the noise loading signal by a prescribed frequency. The shifted noise loading signal is applied via variable attenuator 54 to amplifier 56. The signal output of amplifier 56 is applied to filter network 57 of FIG. 2. Filter network 57 includes a plurality of filters designated 59-1 through 59-c which are used individually as selected by computer 26 which, for example, directs the closure switches 58-1 and 61-1 to complete the signal path for filter 59-1.

The output of filter network 57 is applied to attenuator 63 which adjusts the level and driving impedance of the signal to desired values. Such values are chosen so that apparatus-under-test 64 is subjected to conditions that duplicate an operating environment during normal transmission. The output of apparatus 64 is connected by switch 66 to attenuator 67. The output of attenuator 67 is applied to filter network 68 which has a general configuration corresponding to filter network 57. When computer 26 selects a filter in network 57 to provide the quiet band or notch in the noise loading signal, a matching filter is selected in network 68 by closure of the appropriate switches under the control of computer 26. The selected filter passes the intermodulation distortion products which appear in the notch of the noise signal by the operation of the matching filter in network 57. The output of network 68 is applied to detector circuit 73 which produces test data for processing by computer 26.

Generator 11 includes a plurality of identical maximum length sequence registers 12-1 through 12-a each connected to provide an individual random state sequence which are combined to form the output of generator 11. In register 12-1, shift register 13 and modulo-2 adder 14, which performs the same function as an Exclusive OR gate, are connected to provide a maximum length sequence from the register. Register 13 includes a plurality of $n$ stages, e.g., $n = 15$. Interface circuit 16 provides initial state data for registers 12-1 through 12-a from random number generator 17 and a clock signal from clock 18 via switch 19 to operate the registers at a uniform rate. Random number generator 17 produces a sequence of random numbers wherein each number includes a plurality of binary characters corresponding to the number of stages in register 13. Successive numbers in the sequence are used as starting states of successive registers 12-1 up to 12-a.

Through this arrangement of random setting of initial states, the phases of each of the registers with respect to the other registers are staggered in a random fashion although registers 12-1 through 12-a are identical in other respects. The outputs of the various registers are then combined by signal combiners 21-23 to provide a multilevel signal wherein each level is a combination of concurrent bilevel outputs from the group of registers 12-1 to 12-a. Filter 24 receives the combined multilevel signal and provides a wideband noise loading signal wherein the amplitude differences of the spectral components from the mean amplitude of all spectral components vary according to a Gaussian or normal distribution. Utilization of the plurality of registers 12-a at different phases relaxes the cut-off frequency requirement of filter 24 since the rate of possible level changes in the combined signal of the plurality of registers from combiner 23 is increased by the value of $a$ or the number of registers.

Each time registers 12-1 through 12-a are set to random initial states by generator 17, switch 19 applies the signal from clock 18 to operate the registers for an interval of time or run. For each run, the initial states of registers 12-1 through 12-a are reset in accordance with the output sequence of random number generator 17 and the random phase displacements are maintained by the uniform application of the signal from clock 18 to the plurality of registers 12-a. The amplitude and phases of a given spectral component, from run-to-run, vary in a normal distribution from their mean value. The amplitude distribution of the spectral components in the frequency domain of the wideband noise signal is therefore normal within each run and each of the individual spectral components has amplitudes and phases which are distributed in accordance with a normal distribution from run-to-run or in the time domain.

Although provision is made in FIG. 1 for up to eight registers, the number of registers may be readily increased. On the other hand, seven registers will provide distributions substantially corresponding to a normal distribution. It should be pointed out that this configuration of a plurality of randomly phased registers when combined tend to provide a Gaussian-like distribution of spectral components by using a property of the Central Limit Theorom, which is described in *The Fourier Integral and its Applications*, McGraw-Hill Book Company, Inc., 1962 at pages 227–239 by A. Papoulis. Furthermore, as the number of registers is increased, the conformity to a true Gaussian distribution becomes greater. Notwithstanding that binary pseudorandom noise generators are used in the illustrative embodiment of FIGS. 1 and 2, the Gaussian characteristic of the combined signal is primarily dependent upon the random phase settings so that a plurality of impulse type or triangular wave generators with random phase settings may be used to provide a signal of similar statistical properties. However, binary pseudorandom noise shift registers provide a convenient and accurate arrangement of accomplishing the phase settings by using a random number generator. Moreover, maximal length sequences from registers 12-a were only used to provide high spectral density, i.e., closely spaced spectral components, and shorter sequences may be readily used to provide a noise signal with lower density. In this case, the size of the field of random number generator 17 is equal to value of 2 raised to the $n$ power or the number of stages in each of registers 12-a. Additionally, the all zero state may not be used since the registers will not cycle out of this state.

The noise signal from filter 24 is applied to frequency modulator or frequency converter 32 of frequency shift circuit 31. The other input to modulator 32 is produced by sine wave oscillator 33 and is coupled to the modulator via signal splitting hybrid 34, fixed multiplier 36, bandpass filter 37 and amplifier 38. Modulator 32 combines the complex noise signal with the sinusoidal output of amplifier 38 and produces two complex products translated in frequency. One product has frequencies corresponding to the difference in frequency of the output of amplifier 38 and each of the frequencies of the spectral components in the noise signal, while the other product corresponds to the sum of the frequencies of the spectral components and the output of amplifier 38. Bandpass filter 39 passes the higher frequency band containing the products corresponding to the sums of the frequencies.

The other output of hybrid 34 is amplified by amplifier 41 for application to frequency modulator 42. Low frequency synthesizer 43, whose frequency may be slightly changed by computer 26, provides a sine wave signal for the second input of modulator 42. Crystal filter 44 passes the sum of the two frequencies of the inputs applied to modulator 42. The output of filter 44 is applied to fixed multiplier 46, which multiplies its input frequency by the same constant as multiplier 36. The output of filter 47, which is selected from the output of multiplier 46, drives amplifier 48. As one input of frequency modulator 49 is supplied by amplifier 48, filter 39 furnishes the noise signal increased in frequency by the frequency of the output of amplifier 38.

The output of modulator 49 also produces two complex products. However, lowpass filter 52 selects the lower frequency band translated down in frequency which contains the products corresponding between the differences in frequencies of the two inputs to modulator 49. The output signal of filter 52 has a signal spectrum substantially corresponding to the noise signal applied to modulator 32; however, all the spectral components in the signal are slightly shifted or offset in frequency by a factor which is equal to the product of the frequency of synthesizer 43 times the value of K designed into multiplier 46. Since the output of oscillator 33 is used in modulator 32 to translate the noise signal up in frequency and then in modulator 49 to translate same down in frequency, its effect is totally self-cancelling. However, the additional frequency shift produced by modulator 42 and synthesizer 43 which is multiplied by K in multiplier 46 produces a residual frequency offset in the noise signal. A feature of this arrangement is that since oscillator 33 is used as a frequency component in the second input to both modulators 32 and 49 any frequency shift of drift occurring in the oscillator will take place simultaneously at the two multipliers and have no effect upon the frequency of the output of filter 52.

In FIG. 1, representative portions of the signal spectrum of the noise signal are shown for the input and output of frequency shift circuit 31. It should be noted that the spectral components of the input to circuit 31 are harmonically related to frequency $\omega_o$ while the translated spectral components in the output of circuit 31 are shifted in frequency and are not harmonically related. Circuit 31 therefore provides the frequency shift of $\epsilon$ previously considered theoretically which separates even orders of distortion from odd orders of distortion. The shift in frequency produced by circuit 31 is actually negative since the translation down in frequency at modulator 49 is slightly greater than the translation up in frequencies at modulator 32. This demonstrates the shift may be positive or negative and that the primary purpose of the shift is to disrupt the harmonic relationship of the spectral components of the noise signal.

Bandpass filter 39 is a broadband filter and lowpass filter 52 has a relatively high cut-off frequency so that both filters pass the complete signal spectrum of the noise signal. On the other hand, filters 37, 44 and 47 are narrowband filters each designed to pass a single frequency. Low frequency synthesizer 43 is made variable over a narrow range to provide some latitude of flexibility in the shift frequency to take full advantage of the characteristics of the filters in networks 57 and 68.

The output of circuit 31 is applied to adjustable attenuator 54 which provides an output signal that is controlled by computer 26. Amplifier 56 receives the output of attenuator 54 and applies the amplified signal to the filter in filter network 57 selected by computer 26. Each one of filters 59-1 through 59-c is a band rejection filter and produces a quiet band wherein the distortion measurements will be made. The output of network 57 is applied to attenuator 63 to provide an output that duplicates operating conditions for apparatus-under-test 64. Since the input signal level for apparatus-under-test 64 is set by operation of attenuator 54, amplifier 56 is designed to deliver an output signal of sufficient magnitude to overcome the loss of any of the filters in network 57 and fixed attenuator 63.

In FIG. 2 the representative portions of the signal spectrum are shown for the input and output of apparatus-under-test 64. It should be noted the former includes the notch or quiet band while the latter has the distortion products that appear in the notch due to the nonlinear operation of apparatus-under-test 64. This nonlinear operation produces intermodulation distortion among the several spectral components of the noise signal. The output signal of apparatus-under-test 64 is applied to filter network 68 through switch 66 and attenuator 67. Computer 26 selects a filter in network 68 to pass on the distortion products appearing in the notch. The distortion products in the output of network 68 are applied to detector circuit 73.

In detector circuit 73, frequency modulator 76 combines the output of network 68 and the output of synthesizer 77, whose output frequency is controlled by computer 26. The frequency of synthesizer 77 is selected to obtain optimum performance from the narrow passband of crystal filter 78. More specifically, synthesizer 77 insures that the order of distortion to be measured encounters minimum loss while the closest order of distortion to the measured order is rejected by filter 78. As previously pointed out, the shifted noise spectrum produced by operation of circuit 31 provides the frequency separation between different orders of intermodulation distortion. Ratio detector 79 is therefore able to measure a particular distortion product without the interference of other distortion products. Ratio detector 79 provides a measurement relative to a reference level. This reference level has a frequency which corresponds to the frequency of the order of distortion to be measured. Accordingly, computer 26 adjusts the frequency of synthesizer 82 to the measurement frequency, while reference level circuit 83 supplies an accurate output level to switch 66.

Computer 26 rapidly changes the position of the rotor of switch 66 so that in one instant the intermodulation distortion to be measured is applied to detector 79 and at the next instant the reference level at the same frequency from circuit 83 is applied to detector 79. This arrangement is a well-known technique for obtaining an accurate measurement and has the advantage of being independent of the frequency dependent losses occurring between switch 66 and the input to detector 79. For further information on comparison switching see, for example, *The Bell System Technical Journal*, May, 1961, Vol. 40, No. 3, wherein an article entitled "A Loss and Phase Set for Measuring Transistor Parameters and Two-Port Networks between 5 and 250 mc", by D. Leed and O. Kummer, at page 841 describes another application of this technique. FIG. 5 of this article is a schematic diagram utilizing this technique. Ratio detector 79 indicates the difference in level between the intermodulation distortion and a signal at the same frequency whose level is accurately set to a standard or known value by circuit 83. Modulator 76 is operated at low power levels in a substantially linear region to minimize amplitude dependent nonlinearity in the signal path between switch 66 and ratio detector 79. Therefore, the difference in signal level measured by detector 79 corresponds to the difference in level occurring at switch 66.

As can be appreciated, the apparatus of FIGS. 1 and 2 is designed to be flexible so that its operation can be readily adapted to provide useful measurement data in a number of different applications. In the process of measuring intermodulation distortion products at a number of different points in the frequency range of apparatus-under-test 64 for each run, one would maintain the same random phase displacements in generator 11. For each measurement frequency, computer 26 selects a matching pair of filters: one in network 57 and one in network 68 to provide a measurement at each frequency. The number of frequency points is only limited by the value of $c$, the number of filters in each network. Signal averaging is then used in each run by a repetitive phase coherent measurement at each frequency point until an adequate signal-to-noise ratio is achieved. For each run the random phase displacements in generator 11 are changed in accordance with the output of generator 17 and the frequency measurements are repeated again using the same selection of filters in networks 57 and 68. The runs are repeated as computer 26 combines the test data at each measurement frequency from detector 79 to calculate the value of $P_{IM}$, power of the measured intermodulation distortion product. A sufficient number of runs is indicated when $P_{IM}$ converges to a stable value at each measurement frequency. More specifically, computer 26 performs a summation according to the expression $$P_{IM} = \frac{1}{N} \sum_{i=1}^{N} P_i$$

$P_i$ wherein $N$ = number of runs and $P_i$ = measurement of detector 79 at a selected frequency point.

It is to be understood that the arrangement disclosed in the foregoing is merely illustrative of the application of the principles of the present invention. In this case, an illustrative embodiment is disclosed to provide an automated arrangement with a certain latitude of flexibility. Accordingly, numerous and varied other arrangements including those of lesser complexity and slightly different features may be utilized by those skilled in the art without departing from the spirit and scope of the invention.

What is claimed is:

1. Apparatus for obtaining a measure of nonlinearity introduced by transmission apparatus comprising:
   generating means for producing a wide bandwidth noise signal having a plurality of spectral components wherein the amplitude differences of the spectral components from the mean amplitude of all the spectral components substantially conform to a normal distribution over the frequency range of the wide bandwidth;
   translating means for shifting the frequency of the noise signal by changing the frequency of each of the plurality of spectral components in the noise signal;
   filtering means for substantially eliminating the spectral components in a frequency band to produce an output signal having a quiet band in the noise signal provided by said translating means;
   means for applying the output of said filtering means to said transmission apparatus;
   suppressing means connected to an output of said transmission apparatus for substantially reducing the faithfully delivered portion of the noise signal to reduce its strength relative to the intermodulation distortion products introduced by the nonlinearity of said transmission apparatus, and
   selective detecting means for resolving and indicating the level of one order of the intermodulation distortion products.

2. The invention of claim 1 wherein said generating means comprises:
   a plurality of shift registers, each including feedback means connected to provide a predetermined pseudorandom sequence of characters,
   means for randomly setting initial states among the plurality of shift registers, means for applying a clock signal to the plurality of shift registers so as to maintain the random phase displacements among the states of the shift registers while progressing through their sequences in accordance with the clock signal, and means for combining the sequences of the plurality of shift registers to provide a multilevel signal.

3. The invention of claim 1 wherein said translating means comprises:

first means for translating the spectral components in frequency in a first direction by a prescribed amount, selecting means for passing the higher frequency band which contains the sums of the frequencies of the spectral components and the prescribed frequency, second means for translating the higher frequency band in frequency in a second direction opposite to the first direction by a preselected frequency slightly different from the prescribed frequency, and selecting means for lowpass filtering the lower frequency band which contains the differences in frequencies of the spectral components and the preselected frequency.

4. The invention of claim 3 wherein said selective detecting means comprises:

a variable frequency source providing a single frequency output signal;

converting means for producing the product of the intermodulation products from said transmission apparatus and the single frequency output signal;

means for filtering having a narrow passband, said variable frequency source being tuned so that said means for filtering selectively passes the product formed by the order of distortion to be measured from said multiplying means and rejects other products formed by other orders of distortion, and means for indicating the level of the order of distortion selected by said means for filtering.

5. The invention of claim 4 further comprising:

a single frequency source tuned to the frequency of the measured distortion product producing an output having a prescribed amplitude;

switching means disposed between the output of said transmission apparatus and said suppressing means, said switching means oscillating between the output of said transmission apparatus and the output having a prescribed amplitude, and said means for indicating is a ratio detector for indicating the difference in level between the prescribed amplitude and the level of the measured distortion product.

6. The invention of claim 5 wherein said filtering means comprises a plurality of band rejection filters, and said suppressing means comprises a plurality of bandpass filters and for each bandpass filter there is a matching band rejection filter providing complementary operations on the noise signal applied to and produced by said transmission apparatus.

7. The invention of claim 6 wherein said translating means further comprises:

a single frequency source common to said first means and said second means and used in the frequency translations;

a low frequency source and frequency modulating means both in circuit relationship with said second means for providing the frequency difference between the prescribed frequency and preselected frequency.

8. A method of testing a wideband linear device for minor nonlinearities in its operation comprising the steps of:

generating a wideband noise signal having a Gaussian amplitude distribution of spectral components, the ensemble of spectral components having randomly distributed phases and amplitudes, shifting the frequency of the spectral components of the wideband noise signal by a prescribed frequency, suppressing selected ones of the shifted spectral components to produce a notch essentially void of shifted spectral components in the wideband noise signal, applying the wideband noise signal having the notch to the linear device, selecting third order distortion products produced by nonlinear operation of the linear device from the output signal, and indicating the level of the third order distortion products to obtain a measure of the nonlinearity in the operation of the linear device.

9. The method of claim 8 wherein the step of shifting the noise signal includes the further steps of:

first, translating the noise signal in frequency in one direction;

second, selecting the band of frequencies containing one complete spectrum of the noise signal;

third, translating the selected noise signal in frequency in a second direction opposite to the first direction by an amount different than the first translation to impart a small residual frequency offset on the noise signal, and fourth, selecting the band of frequencies including the noise signal slightly offset in frequency.

10. The method defined in claim 8 wherein the step of generating a wideband noise signal includes the steps of:

first, presetting a plurality of pseudorandom sequences to random initial states;

second, clocking the plurality of pseudorandom sequences through their sequence of states;

third, combining the plurality of pseudorandom sequences to form a multilevel signal, and fourth, lowpass filtering the multilevel signal to provide a noise signal having the Gaussian distribution of spectral components.

11. The method defined in claim 10 wherein the step of presetting is repeated until the level of the third order distortion product converges to a stable value by computing the summation of $$\frac{1}{N} \sum_{i=1}^{N} P_i$$

$P_i$ wherein N is the number of times the presetting step is repeated and $P_i$ represents the individual levels of the third order distortion products.

12. The method defined in claim 11 wherein the step of repeating the resetting further includes performing the measurement of the level of the third order distortion products in a phase coherent manner so that the portion of the measurement due to distortion is constant and that portion of the measurement due to thermal noise becomes self-cancelling.

* * * * *

UNITED STATES PATENT AND TRADEMARK OFFICE
CERTIFICATE OF CORRECTION

PATENT NO. : 4,028,622
DATED : June 7, 1977
INVENTOR(S) : James G. Evans and Gerald D. Haynie It is certified that error appears in the above-identified patent and that said Letters Patent are hereby corrected as shown below:

Column 3, line 28, after "product" delete "of" and substitute --to--.
Column 7, line 4, "Theorom" should read --Theorem--.
Column 8, line 13, "of" should read --or--.
Column 12, line 58, delete "$P_i$".

Signed and Sealed this

Eighth Day of November 1977

[SEAL]

Attest:

RUTH C. MASON
Attesting Officer

LUTRELLE F. PARKER
Acting Commissioner of Patents and Trademarks